United States Patent [19]
Alwais et al.

[11] Patent Number: 5,963,481
[45] Date of Patent: Oct. 5, 1999

[54] EMBEDDED ENHANCED DRAM, AND ASSOCIATED METHOD

[75] Inventors: Michael Alwais; Michael Peters, both of Colorado Springs, Colo.

[73] Assignee: Enhanced Memory Systems, Inc., Colorado Springs, Colo.

[21] Appl. No.: 09/108,089

[22] Filed: Jun. 30, 1998

[51] Int. Cl.⁶ .................................................. G11C 16/04
[52] U.S. Cl. ...................... 365/189.04; 365/203; 711/137
[58] Field of Search .............................. 365/189.04, 198, 365/203; 395/425; 711/137

[56] References Cited

U.S. PATENT DOCUMENTS

| | | | |
|---|---|---|---|
| 4,577,293 | 3/1986 | Matick et al. | 365/189 |
| 4,608,666 | 8/1986 | Uchida | 365/182 |
| 4,725,945 | 2/1988 | Kronstadt et al. | 364/200 |
| 4,794,559 | 12/1988 | Greeberger | 365/49 |
| 4,870,622 | 9/1989 | Aria et al. | 365/230.02 |
| 4,894,770 | 1/1990 | Ward et al. | 364/200 |
| 4,926,385 | 5/1990 | Fujishima et al. | 365/230.03 |
| 4,943,944 | 7/1990 | Sakui et al. | 365/189.05 |
| 5,025,421 | 6/1991 | Cho | 365/230.05 |
| 5,111,386 | 5/1992 | Fujishima et al. | 395/425 |
| 5,134,616 | 7/1992 | Barth, Jr. et al. | 371/10.3 |
| 5,148,346 | 9/1992 | Naab et al. | 365/189.03 |
| 5,179,687 | 1/1993 | Hidaka et al. | 395/425 |
| 5,184,320 | 2/1993 | Dye | 365/49 |
| 5,184,325 | 2/1993 | Lipovski | 365/189.07 |
| 5,214,610 | 5/1993 | Houston | 365/233.5 |

(List continued on next page.)

FOREIGN PATENT DOCUMENTS

| | | |
|---|---|---|
| 41 18 804A1 | 12/1991 | Germany . |
| 60-258792 | 12/1985 | Japan . |
| 63-81692 | 4/1988 | Japan . |
| 1-159891 | 6/1989 | Japan . |

OTHER PUBLICATIONS

"DM 2202 EDRAM 1Mb x 4 Enhanced Dynamic RAM—Product Review," May 22, 1991, Ramtron, Colorado Springs, Colorado.

Sartore, "New Generation of Fast Enhanced DRAMS Replace Static RAM Caches in High–end PC Work Station" 1991.

Niijima et al, "QRAM—Quick Access Memory System", IEEE International Conference, pp. 417–420, Sep. 17, 1990.

Bursky, "Combination DRAM–SRAM Removes Secondary Caches", Electr. Design, vol. 40, No. 2, pp. 39–43, Jan. 23, 1992.

Goodman et al. "Use of Static Column RAM as a Memory Hierachy," 11$^{th}$ Annual Symposium, IEEE, 1984, pp. 167–174.

Ohta et al., "A 1 MB DRAM with 33 MHz Serial I/O Ports" *Digest of Technical Papers*, 1986 IEEE, pp. 274–275 (1986).

Hitachi, "Multiport Video RAM, " Specification for parts HM53461 and HM 53462, pp. 30–33.

Dosaka et al., "A 100MHz 4Mb Cache DRAM with Fast Copy–back Scheme," *Digest of Technical Papers*, 1992 IEEE International Solid–State Circuits Conference, pp. 148–149 (Jun. 1992).

Micron Technical Note TN–04–21, "Reduce Cycle Times with Extended Data Out", Mar. 1993.

*Primary Examiner*—David Nelms
*Assistant Examiner*—David Lam
*Attorney, Agent, or Firm*—William J. Kubida, Esq.; Robert Kelly, Esq.; Holland & Hart LLP

[57] ABSTRACT

An integrated circuit device, and an associated method, in which a logic element, such as a central processing unit, is embedded together with an EDRAM EDRAM (Enhanced Dynamic Random Access Memory) upon a common substrate die. A memory bus interconnects the EDRAM and the logic element. Data thruput rates of memory read and write operations are permitted to be of increased rates relative to the rates permitted of conventional, discrete devices.

22 Claims, 3 Drawing Sheets

U.S. PATENT DOCUMENTS

| | | | |
|---|---|---|---|
| 5,226,009 | 7/1993 | Arimoto | 365/189.04 |
| 5,226,139 | 7/1993 | Fujishima et al. | 395/425 |
| 5,226,147 | 7/1993 | Fujishima et al. | 395/425 |
| 5,249,282 | 9/1993 | Segers | 395/425 |
| 5,305,280 | 4/1994 | Hayano | 365/230.03 |
| 5,329,489 | 7/1994 | Diefendorff | 365/189.05 |
| 5,353,427 | 10/1994 | Fujishima et al. | 395/425 |
| 5,359,722 | 10/1994 | Chan et al. | 395/425 |
| 5,381,370 | 1/1995 | Lacey et al. | 365/200 |
| 5,390,308 | 2/1995 | Ware et al. | 395/400 |
| 5,404,338 | 4/1995 | Murai et al. | 365/233 |
| 5,421,000 | 5/1995 | Fortino et al. | 395/425 |
| 5,471,601 | 11/1995 | Gonzales | 395/403 |
| 5,539,696 | 7/1996 | Patel | 365/189.01 |
| 5,566,318 | 10/1996 | Joseph | 395/445 |
| 5,568,427 | 10/1996 | Takemae | 365/189.02 |
| 5,600,605 | 2/1997 | Schaefer | 365/233 |
| 5,627,791 | 5/1997 | Wright et al. | 362/222 |
| 5,636,173 | 6/1997 | Schaefer | 365/230.03 |
| 5,655,105 | 8/1997 | McLaury | 395/496 |
| 5,666,321 | 9/1997 | Schaefer | 365/233.5 |
| 5,673,233 | 9/1997 | Wright et al. | 365/233 |
| 5,761,695 | 6/1998 | Maeda et al. | 711/5 |
| 5,778,436 | 7/1998 | Kedem et al. | 711/137 | ns ## EMBEDDED ENHANCED DRAM, AND ASSOCIATED METHOD

The present invention relates generally to integrated circuit memory devices. More particularly, the present invention relates to an integrated circuit, and an associated method, in which an EDRAM (Enhanced Dynamic Random Access Memory) device and a processing unit, or other logic element, are together embedded on a common substrate.

By embedding the EDRAM and the processing unit together on a common substrate, the operational rates at which, for example, memory read operations can be effectuated are increased relative to which such operations can be performed when the processing unit and EDRAM are formed of discrete devices. Fuller optimization of the advantages provided by an SRAM (Static Random Access Memory) cache are possible through operation of an embodiment of the present invention because of the increased rates at which the memory access operations can be performed.

BACKGROUND OF THE INVENTION

Digital processing circuitry, and apparatus including such circuitry, is pervasive in modern society to perform a wide range of functions. Such circuitry permits repetitive functions to be carried out at rates much more quickly than the corresponding functions could be performed manually. Large amounts of data, for instance, can be processed at a rapid rate. Such processing of data sometimes includes reading data from, and writing data to, memory locations of a memory device.

A digital computer system, for example, includes a central processing unit and a computer main memory. Memory locations of the computer main memory provide storage locations from which data can be read or to which data can be written. The computer main memory, for instance, is sometimes formed of one or more asynchronous DRAM (Dynamic Random Access Memory) integrated circuits. SRAM (Static Random Access Memory) devices sometimes also form the computer main memory, or a portion thereof. An SRAM device is advantageous because it permits quicker access to the memory locations thereof by making a high-speed locally-accessed copy of the memory available to the central processing unit of the computer system.

Such memory devices are formed on memory locations which form memory arrays. The memory locations of the memory arrays are identified by memory addresses. When memory locations of a memory array are to be accessed, the addresses of the memory locations are provided to decoder circuitry of the memory device. The decoder circuitry decodes the address signals applied thereto to permit access to the memory locations identified by the address signals.

While conventional DRAMs permit relatively quick access to data stored in the memory locations thereof, such as responsive to a read request generated by a computer processing unit, maximum data transmission rates are sometimes limited by the data transmission capacity of a memory bus interconnecting the DRAM and the central processing unit. Using the DRAM together with the central processing unit upon a common substrate, the data transmission rates of a memory bus interconnecting the DRAM and the central processing unit can be increased. Memory accesses by the central processing units to perform read or write operations thereby can be performed at increased rates.

A computer main memory may also be formed of an EDRAM (Enhanced Dynamic Random Access Memory). An EDRAM device includes both a DRAM portion and an SRAM portion. An EDRAM device combines the low cost of a DRAM and provides the high-speed performance of an SRAM. Data is stored in the memory locations of the DRAM portion of the EDRAM. When data stored at selected memory locations of the DRAM is to be read, a memory row of the DRAM containing the selected memory locations is loaded into the SRAM portion of the EDRAM. Once loaded into the SRAM portion, the data is read therefrom. Successive read operations are effectuated in an analogous manner. That is to say, data stored in successive rows of the DRAM portion are loaded into the SRAM portion and then read therefrom. In such manner, the SRAM portion of the EDRAM portion can be of fairly small memory size while still providing the speed advantages associated with SRAM devices. That is to say, the SRAM portion of the EDRAM device need only be of a size of one memory row at which successive rows of data stored in the DRAM portion are successively loaded and successively read.

Conventional EDRAM devices are formed of discrete memory chips, each memory chip having one or more EDRAM banks. The data transmission rate between such an EDRAM device and a central processing unit disposed upon a separate integrated circuit package is sometimes limited by the data transmission capability of a memory bus interconnecting such discrete devices. A manner by which to permit the data transmission rates of data transmitted between an EDRAM and a central processing unit, or other logical device, would increase the rates at which memory read and write operations between the EDRAM and the central processing unit could be performed.

It is in light of this background information related to memory devices that the significant improvements of the present invention have evolved.

SUMMARY OF THE INVENTION

The present invention, accordingly, advantageously provides an integrated circuit, and an associated method, in which an EDRAM (Enhanced Dynamic Random Access Memory) device and a processing unit, or other logic element, are together embedded upon a common substrate.

An integrated circuit constructed according to the teachings of an embodiment of the present invention permits data transfer between the memory device and the processing unit at increased rates relative to conventional data transmission rates of conventional implementations in which the memory device and the processing unit are disposed and discrete, integrated circuit packages. When the processing unit and the EDRAM device are disposed upon a common substrate, memory buses interconnecting the EDRAM device and the processing unit are of increased bus widths, thereby to increase the data thruput rates of data transmitted thereon.

In one aspect of the present invention, the central processing unit is operable to process data read from the EDRAM. The central processing unit generates access requests identifying the addresses of the memory locations from which data is to be read. When the access requests are received at the EDRAM device, data contained in the memory row of the DRAM portion of the EDRAM device is loaded into the SRAM cache portion of the EDRAM device. The data loaded into the SRAM cache is read by the central processing unit and thereafter processed thereat. The EDRAM can be operated in which the DRAM memory portion is "early precharged" so that a subsequent read or write cycle can be started while the current cycle is still in progress. Such capability facilitates address pipelining by the central processing unit. The DRAM memory portion which is precharged can be located in the same memory bank as that in which the current cycle is occurring. Successive accesses of alternating runs of memory banks of the DRAM portion of an EDRAM device is not required, thereby better to maximize the data transmission rates between the EDRAM and the processing unit.

In these and other aspects, therefore, an integrated circuit having a substrate, and an associated method therefor, is provided. The integrated circuit includes at least one DRAM bank disposed at the substrate. At least one DRAM bank is formed of rows and columns of DRAM memory locations and defines a local memory array. An SRAM is associated with each of the at least one DRAM bank. The SRAM is disposed at the substrate. Each SRAM is formed of at least a row of SRAM memory locations. A logic element is disposed at the substrate. The logic element has a first logic portion and a second logic portion. The first logic portion is coupled to the at least one DRAM and to the SRAM associated therewith. The first logic portion is operable to control access to the DRAM memory locations and the SRAM memory locations. The second logic portion is operable to request access to selected memory locations of the at least one DRAM and the SRAM associated therewith and to process data read from the selected memory locations.

A more complete appreciation of the present invention and to the scope thereof can be obtained from the accompanying drawings which are briefly summarized below.

DETAILED DESCRIPTION

Figure 1:
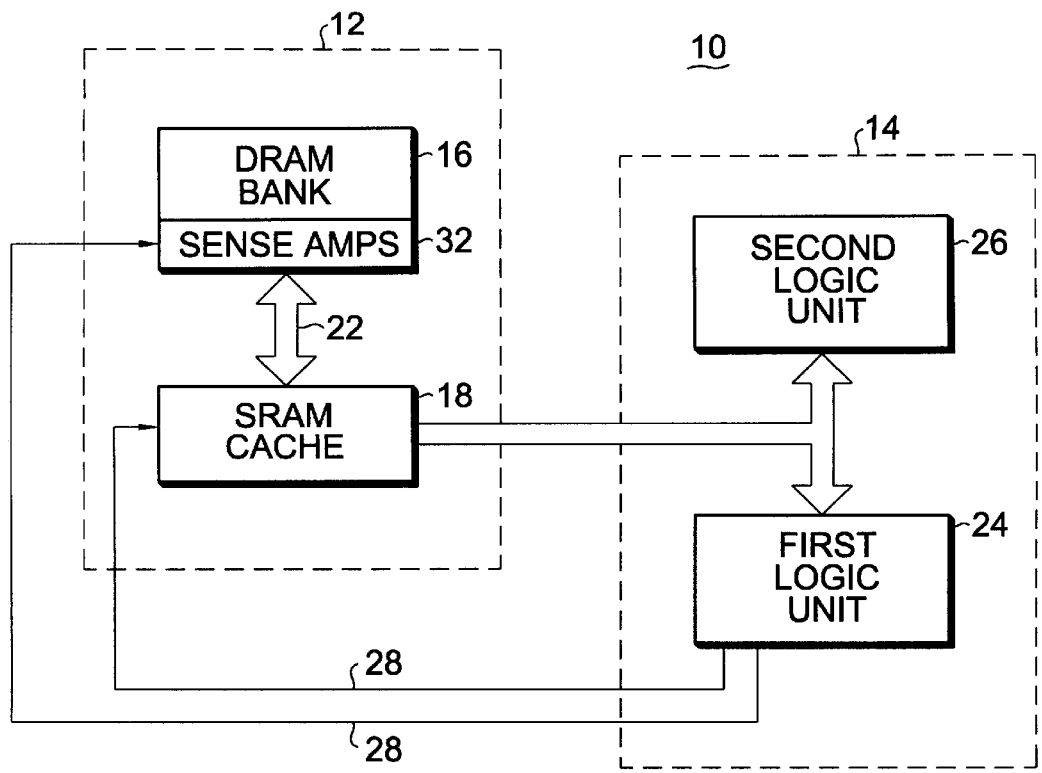
FIG. 1 illustrates a functional block diagram of the integrated circuit of an embodiment of the present invention.

Referring first to FIG. 1, an integrated circuit, shown generally at 10, is formed of an EDRAM (Enhanced Dynamic Random Access Memory) 12 and a logic element 14 embedded together with the EDRAM 12 together to form a single integrated circuit package. Circuit elements forming the EDRAM 12 and the logic element 14 are fabricated, in conventional manner, upon a common substrate according to, e.g., conventional MOS (Metal Oxide Semiconductor) fabrication technique to form an MOS, integrated circuit device. The integrated circuit 10, alternately, may be fabricated in other manners according to another integrated circuit technology.

The EDRAM 12 is functionally equivalent, e.g., to an EDRAM of the EDRAM product family marketed by Enhanced Memory Systems, Inc. and of which further details of such device are enumerated in the Enhanced Memory Systems, Inc.'s 1997 Data Book. As illustrated, the EDRAM 12 includes a DRAM (Dynamic Random Access Memory) bank 16. The DRAM bank 16 is formed of rows and columns of memory locations which, together define a memory array. Data is stored in individual memory locations of the memory array formed of the DRAM bank. Data stored at memory locations of the memory array formed of the DRAM bank can be read pursuant to a read operation.

An SRAM (Static Random Access Memory) cache 18 associated with the DRAM bank 16 and is connected thereto by way of a bus 22. The SRAM cache 18 includes memory locations corresponding to at least a memory row of memory locations of the DRAM bank 16 to which the SRAM is connected. During operation of memory read operations, data stored in memory locations of a memory row of the DRAM bank 16 is first loaded into the SRAM cache 18 and is read therefrom.

The logic element 14 includes a first logic unit 24 and a second logic unit 26. The first logic unit 24 is operable to control, and permit, access to the memory locations of the EDRAM 12. In the exemplary implementation, the first logic unit 24 forms an EDRAM controller operable to perform the functions conventionally performed by, inter alia, an EDRAM controller used in conjunction with a conventional, discrete EDRAM device. Control signal lines 28 are here shown to extend between the logic unit 24, the SRAM cache 18, and sense amplifiers 32 of the DRAM bank 16. Control signals generated by the logic unit 24 cause memory locations of the DRAM bank 16 to be accessed, data stored in such access to memory locations to be located into the SRAM cache 18, and thereafter to be read.

The integrated circuit 10 further includes a memory bus 36 extending between the SRAM cache 18 and the logic element 14. Data read from the SRAM cache 18 is provided to the second logic unit 26 by way of the memory bus 36. The memory bus 36 is also coupled to the first logic unit 24 to permit the first logic unit to monitor activity on the bus 36. That is to say, the logic unit monitors the presence of data transmission upon the memory bus 36.

In the exemplary embodiment, the second logic unit 26 forms a central processor unit capable of performing digital processing functions. Data generated at, or otherwise provided to, the unit 26 can be written to the EDRAM 12, and, data stored at the EDRAM 12 can be read by the unit 26 and processed thereat.

Figure 2:
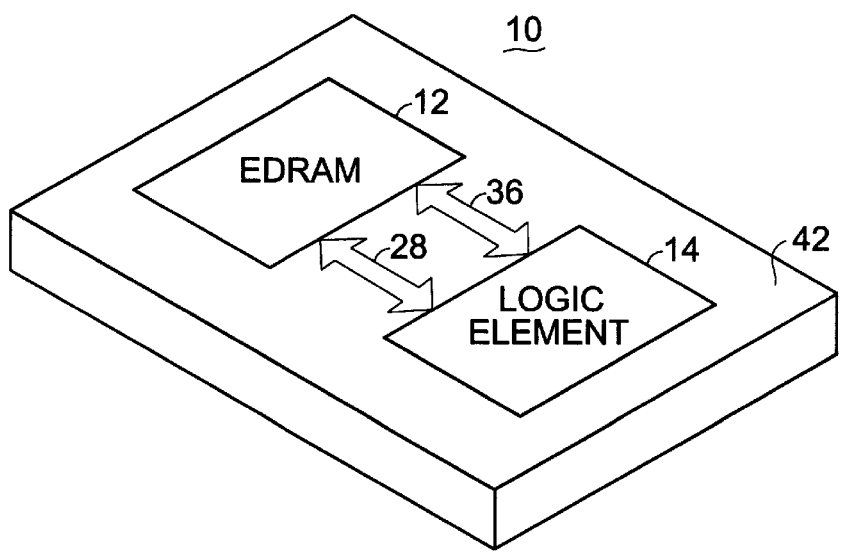
FIG. 2 illustrates a functional block diagram of an exemplary implementation of the integrated circuit of an embodiment of the present invention.

FIG. 2 illustrates again the integrated circuit device 10. Here, the EDRAM 12 and the logic element 14 are shown to be disposed upon a common substrate 42. Because the EDRAM 12 and logic element 14 are formed upon the same substrate, the memory bus 36 is permitted to be of increased thruput capacities relative to the data thruput capacities of conventional memory buses interconnecting discrete elements. Because of the improved thruput capacity, memory read and write operations requested by the logic element 14 can be effectuated more quickly than could be effectuated through the use of discrete devices. In conventional fashion, the integrated circuit device 10, shown in wafer-form in FIG. 2, can be placed in a packet to form an integrated circuit package.

Figure 3:
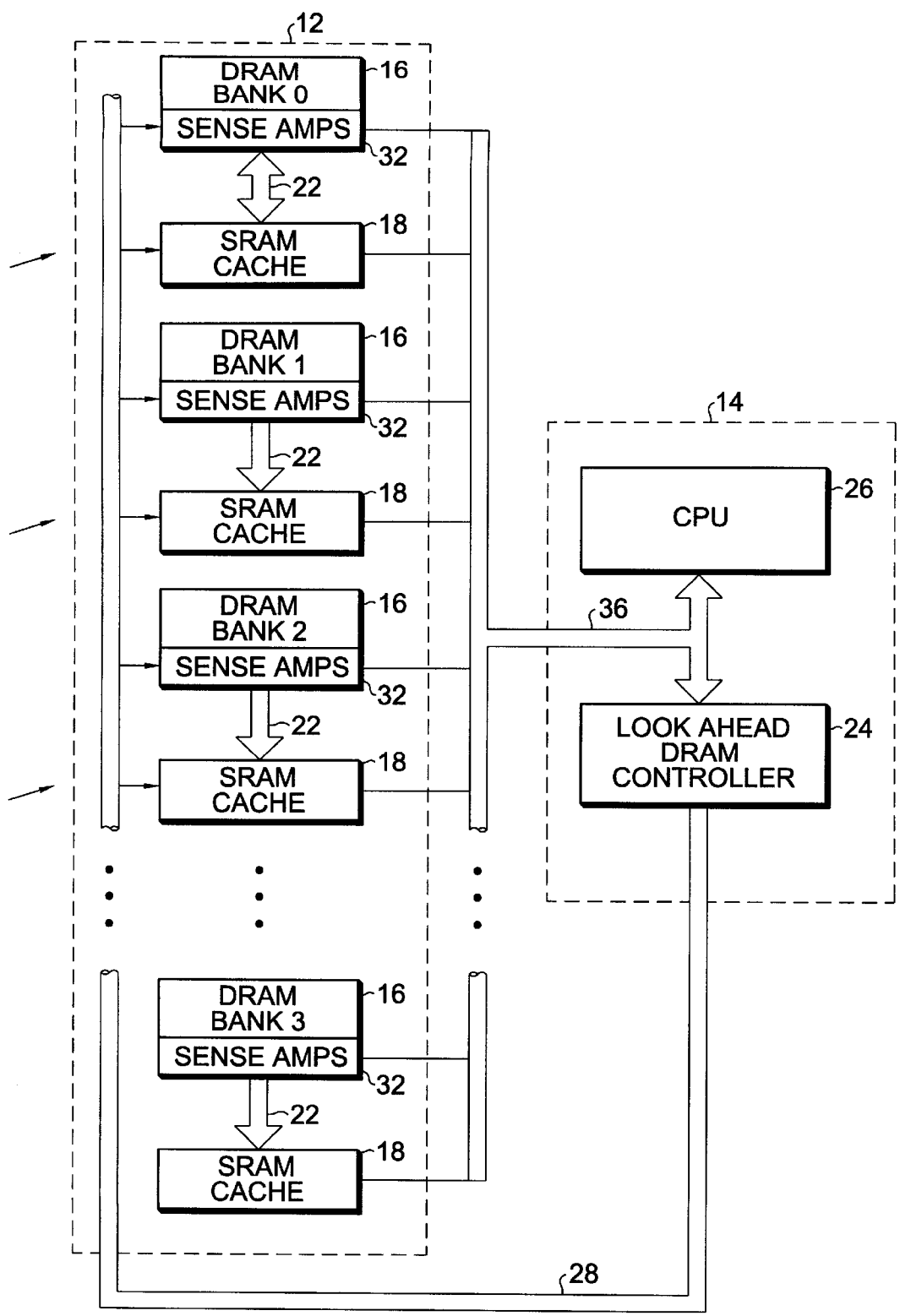
FIG. 3 illustrates a method flow diagram listing the method steps of the method of an embodiment of the present invention.

FIG. 3 illustrates an implementation of the integrated circuit device 10 of an embodiment of the present invention. Here again, the integrated circuit device 10 is formed of an EDRAM 12 and a logic element 14 embedded together with the EDRAM 12 to form a single integrated circuit package. Because the EDRAM and logic element are together disposed at a common substrate, the rate at which data can be transmitted between the EDRAM and the logic element at increased rates relative to the rates at which data is permitted to be transmitted between discrete devices.

Here, the EDRAM 12 includes a plurality of DRAM banks 16, here numbered 0–N. An SRAM cache 18 is associated with each of the DRAM banks 16. Lines 22 interconnect associated ones of the DRAM banks 16 and SRAM caches 18.

The logic element 14 again includes first and second logic units, here a look-ahead DRAM controller 4 and central processing unit 26. The controller 24 is operable to control access to the memory locations of the EDRAM 12 and to cause operation of the EDRAM 12 to effectuate memory read and write operations. The central processing unit 26 is operable, e.g., to issue access requests to access memory locations of the EDRAM 12 to perform the memory read and write operations.

Row address select (RAS) signal lines 28 interconnect to the controller 24 and the SRAM caches 18 and sense amplifiers of respective DRAM bank—SRAM cache 16—18 combinations. Row address select (RAS) signals generated on selected ones of the lines 28 permit memory rows of the EDRAM 12 to be accessed. When, for example, a memory read is to be executed, the memory row of the DRAM bank in which the memory locations containing the data which is to be read is accessed. The data contained in the accessed memory locations is loaded into the SRAM cache associated with the appropriate DRAM bank. Thereafter, the data is read.

The memory bus 36 is here shown to interconnect each of the SRAM caches 18 and the central processing unit 26. Data reads are effectuated by transmitting data loaded into the appropriate SRAM cache upon the memory bus 36 to the central processing unit 26. The controller 24 is again shown to be coupled to the memory bus 36 to monitor activity, i.e., data transmissions, upon the bus.

In the implementation illustrated in the figure, the DRAM banks 16 serve as a main or local memory for the central processing unit 26. The SRAM caches are connected to their associated DRAM banks 16 proximate to the DRAM sense amplifiers 32. As an SRAM cache, 18 is associated with each of the DRAM banks 16, the EDRAM 12 includes multiple SRAM caches. During operation of the integrated circuit device 10, the central processing unit 26 accesses the SRAM caches during as many memory cycles as possible, and the controller 24 performs such functions as DRAM refresh operations, row and column addressing, and bank selection. In an exemplary implementation, the bank selection process is optimized to maximize performance.

When an access request is generated by the central processing unit 26, the controller 24 causes the appropriate DRAM bank 16 to be activated and the appropriate memory row of the activated DRAM bank to be loaded into the SRAM cache 18 associated therewith. By loading the data into the SRAM cache, data access during a memory read is more quickly effectuated. Also, a subsequent memory read operation can be initiated while reading the data from the SRAM cache. That is to say, the next memory row is able to be accessed without incurring a precharge delay, and DRAM refresh operations can also be effectuated without interfering with the memory access.

Each SRAM row cache 18 serves as a read page. A different row (page) may then be held by the sensing amplifiers of the DRAM bank 16 for the purpose of writing data to the DRAM bank. Therefore, on a per-bank basis, a read page (cache) and a write page (sense amplifier) may both be open simultaneously. Traditional page tags are implemented by the controller 24 to best satisfy read and write operations.

Because the DRAM controller 24 monitors the activity on the memory bus 36, the controller is able to specifically evaluate upcoming memory cycles, such as by speculative execution, to indicate which DRAM bank 16 and memory row thereof from which data shall need to be read. By looking ahead in this manner, the controller 24 is able to cause such DRAM row to be opened and loaded into the SRAM cache associated therewith. Thereby, the data shall be ready immediately to be read to the central processing unit 26. Almost every cycle can be executed from the EDRAM 12.

Figure 4:
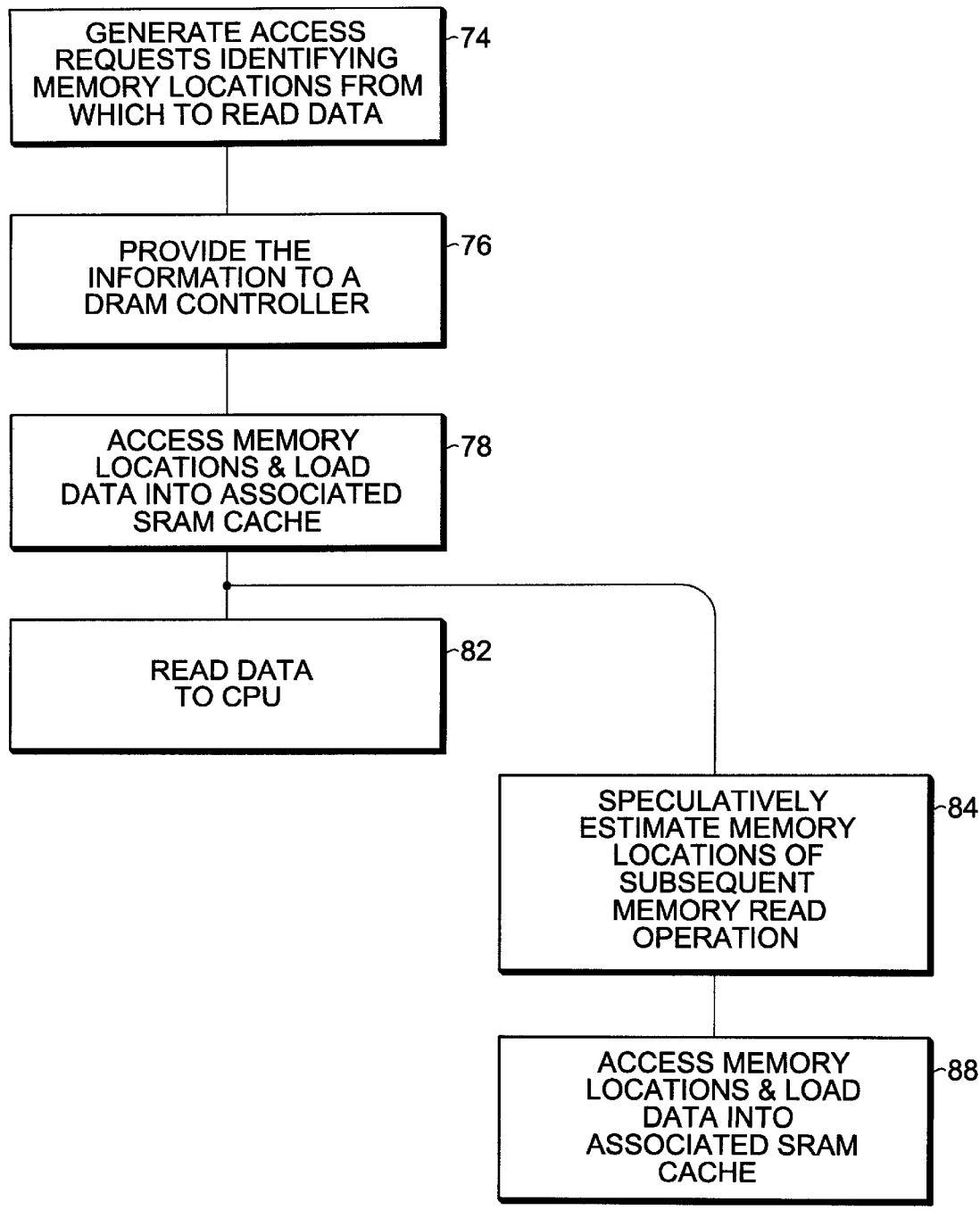
FIG. 4 illustrates a method flow diagram listing the method steps of the method of an embodiment of the present invention.

FIG. 4 illustrates a method, shown generally at 72 of an embodiment of the present invention. The method 72 accesses data stored in an EDRAM, such as the EDRAM 12 forming a portion of the integrated circuit device 10, shown in FIGS. 1–3.

First, and as indicated by the block 74, a central processing unit generates access requests identifying memory locations from which data is to be read. Then, and as indicated by the block 76, such information is provided to a DRAM controller. The DRAM controller is operable to access the appropriate memory location and, as indicated by the block 78, to load data from the identified memory locations into an SRAM cache.

Once loaded into the SRAM cache, and as indicated by the block 82, the data is read therefrom to the central processing unit. While the read operation identified by the block 82 is being carried out, the DRAM controller speculatively estimates the memory locations of a subsequent read operation as indicated by the block 84, and loads the data from the selected memory locations into the SRAM cache associated with the DRAM bank from which the data is loaded. Then, and as indicated by the block 88, the data is read from the SRAM cache to the central processing unit.

Because the EDRAM and the central processing unit are together embodied on the same substrate, the memory bus interconnecting the EDRAM and central processing unit is also formed on the substrate permit increased data thruput rates relative to the use of conventional discrete devices.

The previous descriptions are preferred examples for implementing the invention, and the scope of the invention should not necessarily be limited by this description. The scope of the present invention is defined by the following claims.

We claim:

1. An integrated circuit having a substrate, said integrated circuit comprising:

at least one DRAM (dynamic random access memory) bank disposed at the substrate, said at least one DRAM bank formed of rows and columns of DRAM memory locations and defining a local memory array;

an SRAM (static random access memory) associated with each of said at least one DRAM bank and disposed at the substrate at which said at least one DRAM bank is also disposed, each SRAM formed of at least a row of SRAM memory locations and capable of caching data of at least a portion of a row of the DRAM memory locations with which the SRAM is associated; and a logic element disposed at the substrate at which said at least one DRAM bank and said SRAM associated therewith are also disposed, said logic element having a first logic portion and a second logic portion, said first logic portion coupled to said at least one DRAM and to said SRAM associated therewith and operable to control access to the DRAM memory locations and the SRAM memory locations thereof, said second logic portion operable to request access to selected memory locations of said at least one DRAM and said SRAM associated therewith of to process data read therefrom.

2. The integrated circuit of claim 1 wherein said at least one DRAM bank comprises a first DRAM bank and at least a second DRAM bank.

3. The integrated circuit of claim 2 wherein said SRAM associated with each of said DRAM banks comprises a first SRAM associated with said first DRAM bank and at least a second SRAM associated with said at least second DRAM bank.

4. The integrated circuit of claim 3 wherein the first logic portion of said logic element is operable to cause, during overlapping time periods, data to be read from a first selected row of memory locations, loaded from a selected one of said first and at least second DRAM bank into said SRAM associated therewith, and to cause data to be written to a second selected row of a selected one of said first and at least second DRAM bank.

5. The integrated circuit of claim 4 wherein said logic element is operable to cause data to be read from the first selected row of memory locations loaded from said first DRAM bank, and to cause data to be written to the second selected row of said second DRAM bank.

6. The integrated circuit of claim 4 wherein said logic element is operable to case data to be read from the first selected row of memory locations loaded from said first DRAM bank, and to cause data to be written to the second selected row of said first DRAM bank.

7. The integrated circuit of claim 3 wherein the first logic portion of said logic element is operable to cause access to a first selected row and a second selected row of a selected one of said first and at least second DRAM bank during at least overlapping time periods, the first selected row forming a read row from which to read data and the second selected row forming a write row from which to write data during the overlapping time periods.

8. The integrated circuit of claim 1 wherein the first logic portion of said logic element is operable to cause first data stored in a first row of said DRAM to be cached at said SRAM associated therewith, to cause second data to be written to a second row of said DRAM, and thereafter to cause the first data to be read from said SRAM.

9. The integrated circuit of claim 1 wherein, when the first logic portion of said logic element accesses selected memory locations of said at least one DRAM bank, data stored in a row of the local memory array defined by said at least one DRAM bank containing the selected memory locations is loaded into said SRAM associated with said at least one DRAM bank, the data loaded into said SRAM thereafter to be read therefrom to be processed by the second logic portion of said logic element.

10. The integrated circuit of claim 9 wherein the first logic portion is further operable to cause said at least one DRAM bank from which the data is loaded into said SRAM to be closed and precharged.

11. The integrated circuit of claim 10 wherein the first logic portion is further operable to cause said at least one DRAM bank to be precharged at least partially concurrently with reading of the data loaded into said SRAM.

12. The integrated circuit of claim 11 further comprising a memory bus interconnecting said logic element and said SRAM, and wherein the first logic portion of said logic element is further operable to monitor data transmission on said memory bus.

13. The integrated circuit of claim 12 wherein the first logic portion of said logic element comprises a look-ahead controller operable to anticipate subsequent read requests of the second logic portion, the read requests identifying the memory locations at which data to be read is stored.

14. The integrated circuit of claim 13 wherein said look-ahead controller comprising the first logic portion of said logic element generates row address selected signals, values of the row address selected signals identifying rows in which the selected memory locations are formed.

15. The integrated circuit of claim 1 wherein the second logic portion of said logic element comprises a digital processing unit forming a computer central processing unit.

16. A method for accessing data, said method comprising the steps of:

generating a first access request for accessing data stored at memory locations of a first memory row, the memory locations of the first memory row disposed upon a substrate;

accessing the data stored at the memory locations identified in the first access request;

while the data stored at the memory locations identified by the first access request is being accessed, generating a second access request for accessing data stored at memory locations of a second memory row, the memory locations of the second memory row upon the substrate at which the memory locations of the first memory row are also disposed; and accessing the data stored at the memory locations identified in is the second access request.

17. The method of claim 16 wherein the first memory row identified by the first access request generated during said step of generating the first access request is located at a selected one of a first and at least a second DRAM (dynamic random access memory) bank.

18. The method of claim 17 wherein the first access request generated during said step of generating the first access request is generated by a processing unit disposed upon a substrate common to the first and the at least second DRAM.

19. The method of claim 18 wherein said step of accessing the data stored at the memory locations identified in the first access request comprises:

loading the data stored at the selected one of the first and the at least second DRAM into an SRAM (Static Random Access Memory) associated therewith, the SRAM disposed upon the substrate common to the processing unit and the first and the at least second DRAM; and reading the data loaded into the SRAM to the processing unit.

20. The method of claim 19 wherein the second memory row identified by the second access request generated during said step of generating the second access request is located at a selected one of the first and the at least second DRAM bank.

21. The method of claim 20 wherein the second access request generated during said step of generating the second access request is generated by the processing unit.

22. The method of claim 20 wherein said step of accessing the data stored at the memory locations identified in the second access request comprises:

loading the data stored at the selected one of the first and the at least second DRAM into an SRAM associated therewith; and reading the data loaded into the SRAM to the processing unit.

* * * * *